United States Patent
Seeger et al.

(10) Patent No.: US 11,835,538 B2
(45) Date of Patent: Dec. 5, 2023

(54) APPLYING A POSITIVE FEEDBACK VOLTAGE TO AN ELECTROMECHANICAL SENSOR UTILIZING A VOLTAGE-TO-VOLTAGE CONVERTER TO FACILITATE A REDUCTION OF CHARGE FLOW IN SUCH SENSOR REPRESENTING SPRING SOFTENING

(71) Applicant: INVENSENSE, INC., San Jose, CA (US)

(72) Inventors: Joseph Seeger, Menlo Park, CA (US); Pradeep Shettigar, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 17/894,077

(22) Filed: Aug. 23, 2022

(65) Prior Publication Data
US 2022/0413003 A1    Dec. 29, 2022

Related U.S. Application Data

(63) Continuation of application No. 16/460,901, filed on Jul. 2, 2019, now Pat. No. 11,428,702.

(Continued)

(51) Int. Cl.
*G01P 15/125* (2006.01)
*G01P 1/00* (2006.01)
(Continued)

(52) U.S. Cl.
CPC .............. *G01P 1/006* (2013.01); *G01P 15/00* (2013.01); *G01P 15/125* (2013.01); *H03F 3/45* (2013.01);
(Continued)

(58) Field of Classification Search
CPC ........ G01P 1/006; G01P 15/00; G01P 15/125; H03F 3/45; H03F 2200/48;
(Continued)

(56) References Cited

U.S. PATENT DOCUMENTS 5,675,296 A    10/1997  Tomikawa
6,407,631 B2*  6/2002  Yamashita .............. G01P 15/09
                                               330/109

(Continued)

FOREIGN PATENT DOCUMENTS

EP    1873489 A1    1/2008
EP    2317645 A1    5/2011

OTHER PUBLICATIONS

International Search Report dated Sep. 12, 2019 for PCT Application No. PCT/US2019/042092, 16 pages.

(Continued)

*Primary Examiner* — Jung Kim
(74) *Attorney, Agent, or Firm* — Amin, Turocy & Watson, LLP

(57) ABSTRACT

Reducing a sensitivity of an electromechanical sensor is presented herein. The electromechanical sensor comprises a sensitivity with respect to a variation of a mechanical-to-electrical gain of a sense element of the electromechanical sensor; and a voltage-to-voltage converter component that minimizes the sensitivity by coupling, via a defined feedback capacitance, a positive feedback voltage to a sense electrode of the sense element—the sense element electrically coupled to an input of the voltage-to-voltage converter component. In one example, the voltage-to-voltage converter component minimizes the sensitivity by maintaining, via the defined feedback capacitance, a constant charge at the sense electrode. In another example, the electromechanical sensor comprises a capacitive sense element comprising a first node comprising the sense electrode. Further, a bias (Continued)

voltage component can apply a bias voltage to a second node of the electromechanical sensor. In yet another example, the electromechanical sensor comprises a piezoelectric sense element.

7 Claims, 15 Drawing Sheets

Related U.S. Application Data

(60) Provisional application No. 62/718,954, filed on Aug. 14, 2018.

(51) Int. Cl.
 G01P 15/00 (2006.01)
 H03F 3/45 (2006.01)

(52) U.S. Cl.
 CPC .............. *H03F 2200/48* (2013.01); *H03F 2203/45156* (2013.01); *H03F 2203/45546* (2013.01)

(58) Field of Classification Search
 CPC . H03F 2203/45156; H03F 2203/45546; H03F 3/45475; H03F 3/70; H03F 1/38; G01D 3/02
 See application file for complete search history.

(56) References Cited

U.S. PATENT DOCUMENTS

| | | |
|---|---|---|
| 2008/0000296 A1 | 1/2008 | Johnson |
| 2009/0322353 A1 | 12/2009 | Ungaretti et al. |
| 2014/0264652 A1 | 9/2014 | Cagdaser et al. |
| 2015/0023529 A1 | 1/2015 | Barzen et al. |

OTHER PUBLICATIONS

Jawed, Syed Arsalan. "CMOS Readout Interfaces for MEMS Capacitive Microphones" PhD Dissertation—University of Trento, Mar. 2009, 123 pages.
International Search Report dated Oct. 9, 2019 for PCT Application No. PCT/US2019/046551, 16 pages.
International Preliminary Report on Patentability dated Feb. 25, 2021 for PCT Application No. PCT/US2019/046551, 9 pages.
Notice of Allowance dated Apr. 2, 2021 for U.S. Appl. No. 16/540,852, 27 pages.
European Office Action dated Mar. 23, 2021 for EP Application No. 19746389.6, 3 pages.
Office Action dated Nov. 30, 2021 for European Patent Application No. 19746389.6, 8 pages.
Office Action dated Jul. 20, 2021 for U.S. Appl. No. 16/460,901, 33 pages.
International Preliminary Report on Patentability dated Feb. 16, 2021 for PCT Application No. PCT/US2019/042092, 8 pages.

\* cited by examiner

APPLYING A POSITIVE FEEDBACK VOLTAGE TO AN ELECTROMECHANICAL SENSOR UTILIZING A VOLTAGE-TO-VOLTAGE CONVERTER TO FACILITATE A REDUCTION OF CHARGE FLOW IN SUCH SENSOR REPRESENTING SPRING SOFTENING

RELATED APPLICATION

This patent application claims priority to, and is a continuation of, U.S. patent application Ser. No. 16/460,901 (now U.S. Pat. No. 11,428,702), filed Jul. 2, 2019, and entitled "APPLYING A POSITIVE FEEDBACK VOLTAGE TO AN ELECTROMECHANICAL SENSOR UTILIZING A VOLTAGE-TO-VOLTAGE CONVERTER TO FACILITATE A REDUCTION OF CHARGE FLOW IN SUCH SENSOR REPRESENTING SPRING SOFTENING," which claims priority to U.S. Provisional Patent Application No. 62/718,954, filed on Aug. 14, 2018, and entitled "GYRO SENSE AMP ARCHITECTURE FOR CANCELLING SPRING SOFTENING EFFECT BY APPLYING CONSTANT CHARGE," the entirety of which applications are hereby incorporated by reference herein.

TECHNICAL FIELD

The subject disclosure generally relates to embodiments for applying a positive feedback voltage to an electromechanical sensor utilizing a voltage-to-voltage (V2V) converter to facilitate a reduction of charge flow in such sensor representing spring softening.

BACKGROUND

Conventional sensor technologies are susceptible to changes in sensitivity of an electromechanical sense element of a sensor due to die stress, e.g., caused by variations in assembly of a corresponding device, variations in operating temperature of the corresponding device, variations in operation of the corresponding device over time, etc. In this regard, the changes in sensitivity can represent a "spring softening" effect on the electromechanical sense element that alters a resonant frequency and gain of such element. Further, conventional sensor technologies utilizing a charge-to-voltage (C2V) architecture to maintain a constant voltage across a sense gap of a capacitive-based sense element can further increase the spring softening effect on such element. In this regard, conventional sensor technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
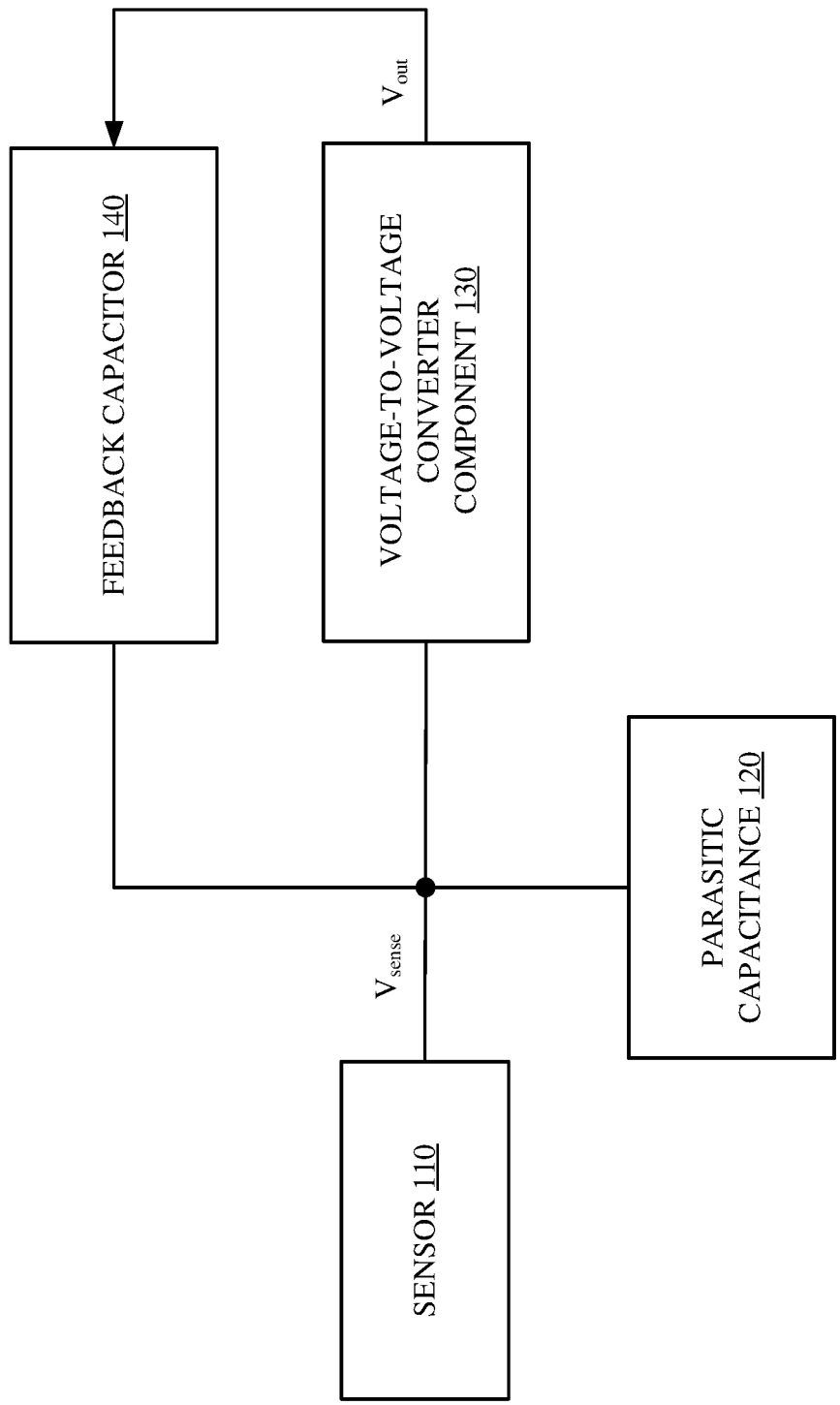
FIG. 1 illustrates a block diagram of a sensor system utilizing a V2V converter to apply a positive feedback voltage to an electromechanical sensor to facilitate a reduction of charge flow in such sensor, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Conventional electromechanical sensor technologies are sensitive to die stress, which can change a gain of an electromechanical sense element of a corresponding sensor. For example, the die stress can change, affect, etc. a spring softening of the electromechanical sense element, resulting in a change in the gain of the electromechanical sense element. Further, a change in a bias voltage that has been applied to the electromechanical sense element can change the gain of the electromechanical sense element.

Further, conventional sensor technologies utilizing a C2V architecture to maintain a constant voltage across a sense gap of a capacitive sense element can further change, alter, increase the spring softening of the electromechanical sense element. On the other hand, various embodiments disclosed herein can reduce a sensitivity of a sense element of an electromechanical sensor, e.g., gyroscope, accelerometer, etc. with respect to a variation of a mechanical-to-electrical gain of the sense element by maintaining a constant charge at sense electrode(s) of such sensor—effectively eliminating the spring softening.

For example, a system, e.g., gyroscope, accelerometer, etc. can comprise an electromechanical sensor, e.g., which generates a current, charge flow, etc. in response to an excitation, movement, etc. of such sensor. A sensitivity of a sense element of the electromechanical sensor with respect to a variation of a mechanical-to-electrical gain of the sense element can result from, e.g., changes in bias voltage, changes in fabrication of the electromechanical sensor, die stress variation over assembly of the electromechanical sensor, variation of operating conditions, e.g., temperature, humidity, etc. of the electromechanical sensor during an operational lifetime of such sensor, etc. Such variation in gain can represent a spring softening effect, e.g., caused by a change in a distance, or gap, between sensing node(s), element(s), etc. of the electromechanical sensor that occurs over time; caused by surface voltage(s) that have been generated on the sensing node(s), element(s), etc. of the electromechanical sensor over time, etc.

In this regard, a V2V converter component of the system can generate, via an output of the voltage-to-voltage converter component, a positive feedback voltage, and minimize the sensitivity with respect to a change in the mechanical-to-electrical gain of the sense element by coupling, via a defined feedback capacitance, the positive feedback voltage to a sense electrode of the sense element, e.g., by maintaining, via the defined feedback capacitance, a constant charge at the sense electrode—the sense electrode being electrically coupled to an input of the voltage-to-voltage converter component.

In one embodiment, the electromechanical sensor comprises a piezoelectric sense element comprising the sense electrode.

In another embodiment, the electromechanical sensor comprises a capacitive sense element comprising a first node comprising the sense electrode, and a bias voltage component that applies a bias voltage to a second node of the capacitive sense element. In other embodiment(s), e.g., in which the electromechanical sensor comprises a microphone, the bias voltage component applies the bias voltage to the sense electrode.

In an embodiment, the V2V converter component comprises a unity-gain voltage buffer comprising, within a defined error tolerance (e.g., +/−1%), a gain of one. Further, the input of the V2V converter component is electrically connected to an input of the unity-gain voltage buffer.

In one embodiment, an output of the unity-gain voltage buffer is electrically connected to an output of the V2V converter component.

In another embodiment, the input of the unity-gain voltage buffer is electrically connected to a first capacitance terminal of a defined shield capacitance of the system, e.g., corresponding to shield routing, e.g., electrical trace(s) of the system that facilitate shielding at least a portion of the sense electrode from an electromagnetic field.

Further, the output of the unity-gain voltage buffer is electrically connected a second capacitance terminal of the defined shield capacitance—the unity-gain voltage buffer comprising a bootstrapping buffer. In this regard, the shield routing is bootstrapped to a voltage of the sense electrode using the bootstrapping buffer to eliminate, substantially reduce (e.g., by over 95%), etc. a change in charge at the sense electrode due to parasitic capacitance of the shield routing.

In yet another embodiment, the V2V converter component further comprises: a defined input capacitance; a defined amplifier feedback capacitance; and an inverting amplifier comprising a defined negative gain represented by a ratio of the defined input capacitance to the defined amplifier feedback capacitance. In this regard, the defined input capacitance is electrically coupled between the output of the unity-gain voltage buffer and an input of the inverting amplifier; and the defined amplifier feedback capacitance is electrically coupled between the input of the inverting amplifier and an output of the inverting amplifier.

Further, the V2V converter component comprises a unity-gain inverting voltage buffer comprising, within a defined error tolerance, e.g., within 1%, a gain of negative one. In this regard, the output of the inverting amplifier is electrically connected to an input of the unity-gain inverting voltage buffer, and an output of the unity-gain inverting voltage buffer is electrically connected to the output of the V2V converter component.

In other embodiment(s), the inverting amplifier can comprise a differential amplifier with respective defined input capacitances of the system being electrically coupled between respective sense electrodes of the sense element and respective differential inputs of the differential amplifier—the voltage-to-voltage converter component minimizing a sensitivity of the sense element with respect to changes in the mechanical-to-electrical gain of the sense element by coupling, via respective defined feedback capacitances, a positive differential feedback voltage to the respective sense electrodes of the sense element. In this regard, a corresponding gain of the differential amplifier can be inverted by switching outputs of the differential amplifier that are connected to differential inputs of a following stage, amplification stage, capacitive stage, etc. Accordingly, use of the unity-gain inverting voltage buffer is not required. Further, it should be appreciated that in utilizing the differential amplifier, the capacitive sense element comprises differential sense electrodes, the respective sense electrodes, etc. in which respective capacitive sense elements are connected to the respective differential inputs of the differential amplifier.

In embodiment(s), respective defined amplifier feedback capacitances are electrically coupled between the respective differential inputs of the differential amplifier and respective outputs of the differential amplifier. Further, the respective defined feedback capacitances are electrically coupled between the respective outputs of the differential amplifier and the respective sense electrodes of the sense element In an embodiment, a defined parasitic capacitance is electrically connected to the input of the V2V converter component.

In one embodiment, a value of the defined feedback capacitance is proportional, based on the defined negative gain of the inverting amplifier, to the defined parasitic capacitance.

In other embodiment(s), the input of the inverting amplifier is coupled, via a coupling capacitance, to a defined self-test voltage that facilitates generation of a force on a proof mass of the sensor, and/or to a defined quadrature cancellation voltage that facilitates a reduction of a value of a quadrature portion of the output of the unity-gain voltage buffer.

In yet other embodiment(s), the system does not utilize the bootstrapping buffer, and the defined parasitic capacitance is electrically connected to the defined input capacitance that is electrically coupled to the input of the inverting amplifier. In this regard, the defined parasitic capacitance comprises the defined shield capacitance corresponding to at least one electrical trace of the system that facilitates the shielding of at least the portion of the sense electrode from the electromagnetic field. Further, unlike embodiment(s) comprising the bootstrapping buffer, the value of the defined feedback capacitance is proportional, based on the defined negative gain of the inverting amplifier, to a sum of the defined parasitic capacitance and the defined input capacitance.

In an embodiment, a method can comprise detecting, by a system comprising a MEMS sensor, a sensitivity of a sense element, an electromechanical sense element, etc. of the MEMS sensor with respect to a variation in an electromechanical gain of the sense element; and minimizing the sensitivity of the sense element by coupling, utilizing a V2V converter of the system via a defined feedback capacitance, a positive feedback voltage to the sense element.

In one embodiment, the minimizing the sensitivity comprises maintaining, via the V2V converter, a constant charge at the sense element.

In another embodiment, a method can comprise modifying, by the system, a bias voltage that has been applied to the sense element, and in response to the modifying the bias voltage, minimizing, by the system, the sensitivity of the sense element with respect to the variation in the electromechanical gain of the sense element.

In this regard, in embodiment(s), the method can comprise modifying the bias voltage, e.g., sweeping the bias voltage over respective frequencies, and in response to the modifying, sweeping, etc. of the bias voltage, determining, by the system, a change in a resonant frequency of the sense element—the resonant frequency corresponding to a determined global maximum of a magnitude of an output voltage of the MEMS based sensor. In turn, the method can comprise modifying, by the system, a value of the defined feedback capacitance, which has been used to apply the positive feedback voltage to the sense element, to minimize the change in the resonant frequency of the sense element.

In other embodiment(s), the method can comprise modifying, by the system via an amplifier feedback capacitance coupled between an input of an inverting amplifier of the MEMS based sensor and an output of the inverting amplifier, a negative gain of the inverting amplifier to minimize the change in the resonant frequency of the sense element.

As described above, conventional sensor technologies are susceptible to changes in sensitivity of an electromechanical sense element, e.g., due to changes of a bias voltage that has been applied to such element, due to die stress, e.g., caused by variations in assembly, operating conditions, and/or operation of a corresponding device over time, e.g., the changes in sensitivity representing a spring softening effect on the electromechanical sense element that alters a resonant frequency and gain of the sense element, e.g., caused by a change in a distance, or sense gap, between sensing node(s,) element(s), etc. of a capacitive-based sense element that occurs over time; caused by surface voltage(s) that have been generated on sensing node(s), element(s), etc. of the capacitance-based sense element over time, etc. Further, conventional sensor technologies that utilize a C2V architecture to maintain a constant voltage across the sense gap can further increase the spring softening effect on the capacitive-based sense element.

On the other hand, various embodiments disclosed herein can reduce a variation in a sensitivity of an electromechanical sensor, e.g., gyroscope, accelerometer, etc. by maintaining a constant charge at sense element(s), electrode(s), etc. of such sensor—effectively eliminating the spring softening effect. In this regard, and now referring to FIG. 1, a sensor system (100) can comprise an electromechanical sensor (110), e.g., a capacitive-based sensor, a piezoelectric-based sensor, etc. comprising a sensitivity that can change, vary, etc., e.g., due to changes in a bias voltage of such sensor, due to fabrication and/or die stress variation over assembly of such sensor, due to variation of operating conditions, e.g., temperature, humidity, etc. during operation of such sensor over time, etc.

In turn, the sensor system can comprise a V2V converter component (130) that can couple, via a feedback capacitor (140) coupled between the V2V converter component and a sense electrode corresponding to a sense electrode voltage ("$V_{sense}$") of a sense element of the sensor, a positive feedback voltage ("$V_{out}$") to the sense electrode, e.g., to maintain a constant charge at the sense electrode, node, etc., to minimize, reduce, etc. the change in the sensitivity of the electromechanical sensor.

Figure 2:
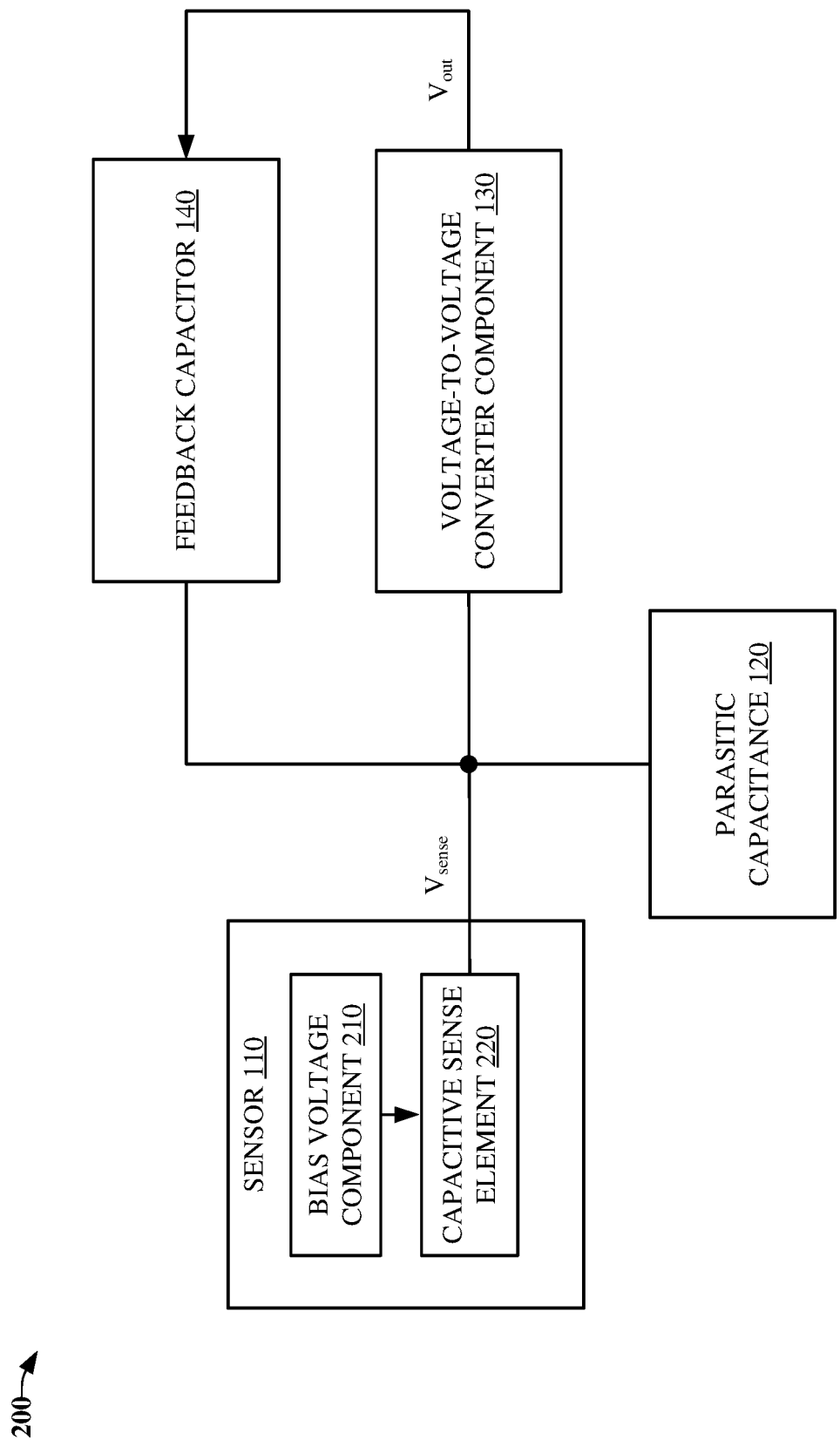
FIG. 2 illustrates a block diagram of a sensor system utilizing a V2V converter to apply a positive feedback voltage to an electromechanical sensor comprising a capacitive sense element that is biased by a bias voltage component, in accordance with various example embodiments.
Figure 3:
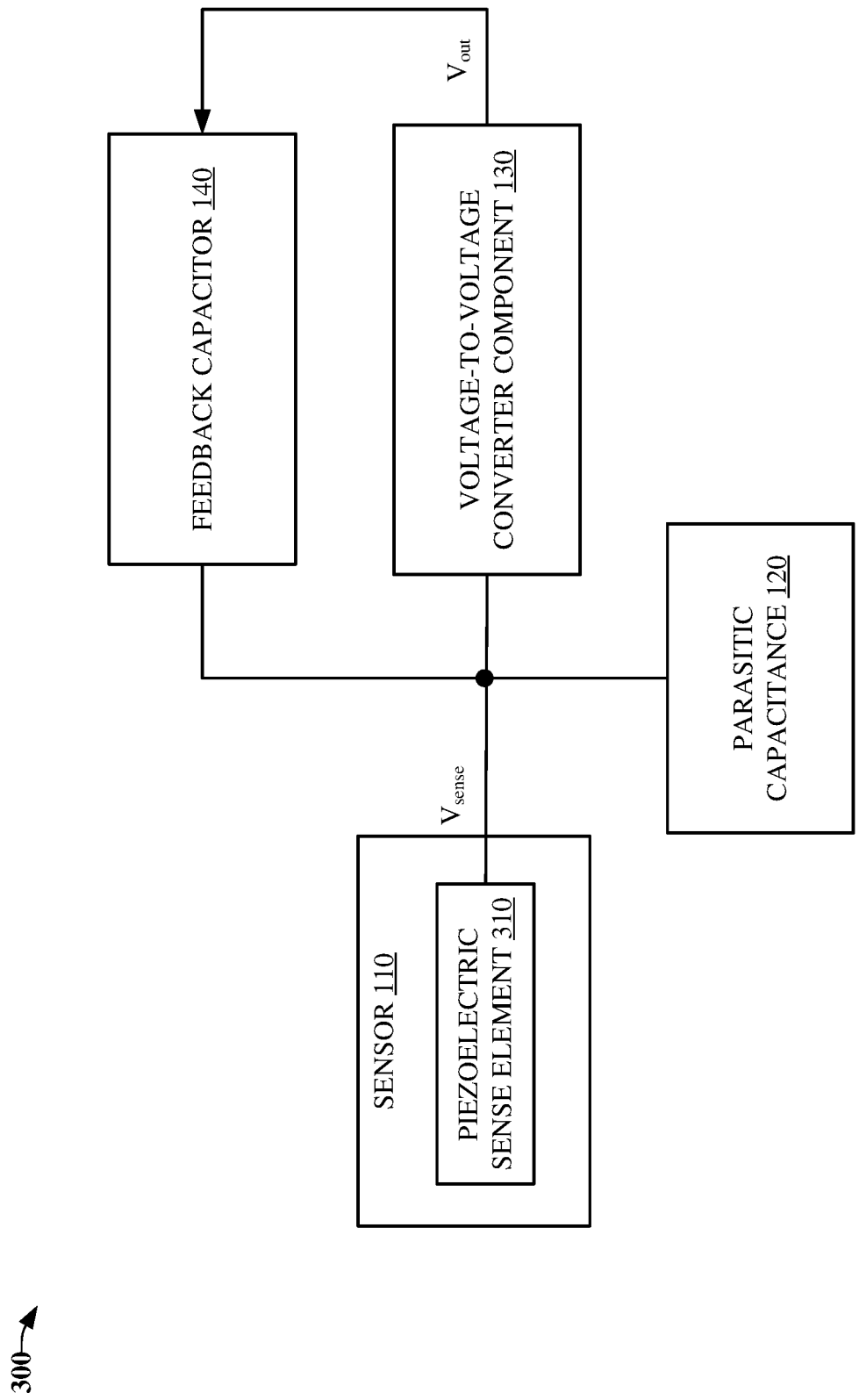
FIG. 3 illustrates a block diagram of a sensor system utilizing a V2V converter to apply a positive feedback voltage to an electromechanical sensor comprising a piezoelectric sense element, in accordance with various example embodiments.

In embodiment(s) illustrated by FIG. 2, the electromechanical sensor can comprise a sense capacitor (220) (see "$C_{sense}$" described below) comprising the sense electrode, and a bias voltage component (210) that can apply a bias voltage to another electrode, node, etc. of the sense capacitor. In other embodiment(s) illustrated by FIG. 3, the sensor can comprise a piezoelectric sensor (310) comprising the sense electrode.

Figure 4:
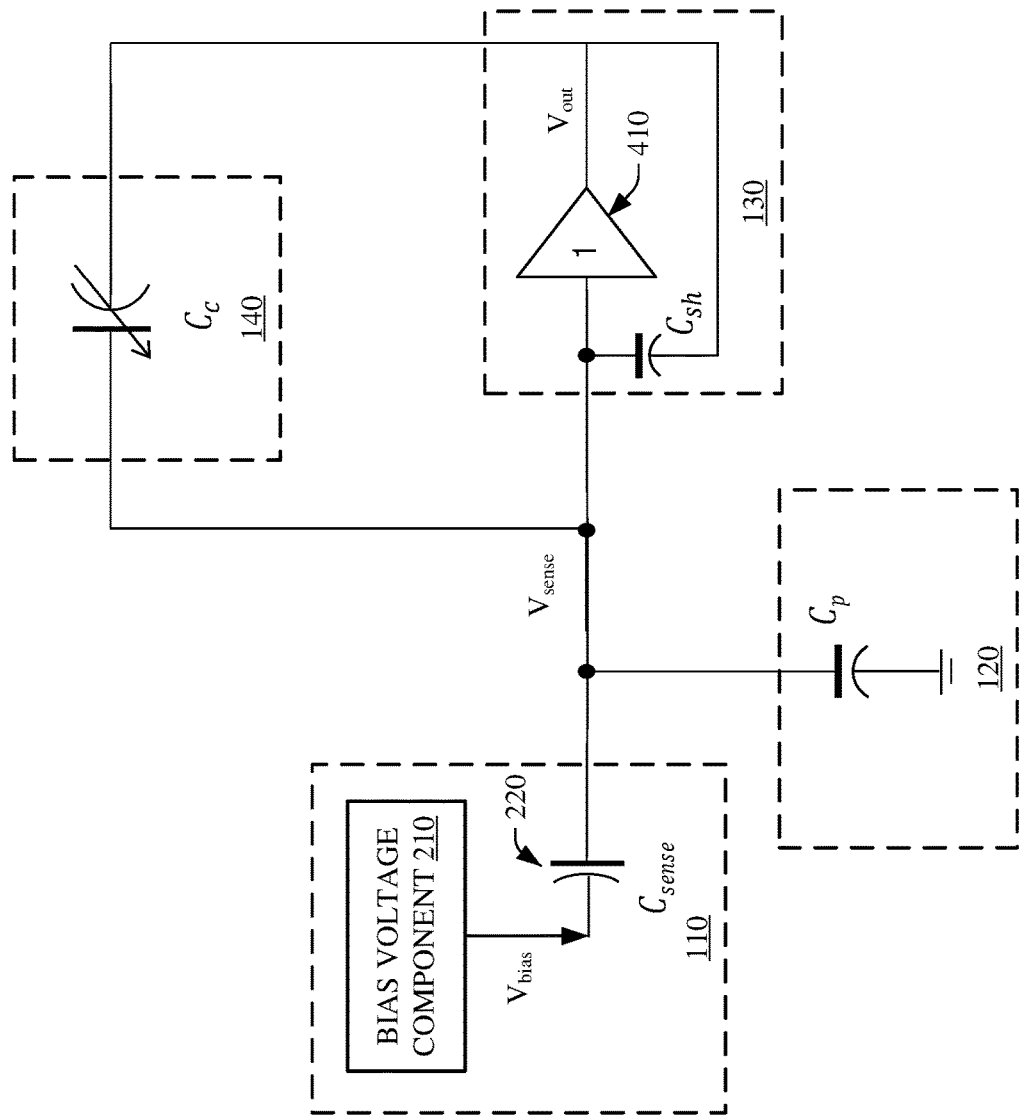
FIG. 4 illustrates a block diagram of a sensor system comprising a V2V converter component that applies a positive feedback voltage to a capacitive sense element utilizing a bootstrap buffer that bootstraps a shield capacitance of such sensor to a sense-node voltage of the sensor, in accordance with various example embodiments.

Referring now to FIG. 4, the V2V converter component can comprise a unity-gain voltage buffer (410) comprising, within a defined error tolerance (e.g., 1%), a gain of one. Further, an input of the V2V converter component can be electrically connected to, comprise, etc. an input of the unity-gain voltage buffer. In turn, the input of the unity-gain voltage buffer can be electrically connected to a first terminal, node, etc. of a defined shield capacitance ($C_{sh}$) of the system, and an output of the unity-gain voltage buffer can be electrically connected a second terminal, node, etc. of the defined shield capacitance.

In this regard, the defined shield capacitance can correspond to a shield parasitic capacitance of at least one electrical trace of the system that is directed to shielding at least a portion of the sense electrode from an electromagnetic field. Further, the unity-gain voltage buffer comprises a bootstrapping buffer that "bootstraps" the defined shield capacitance to the sense electrode—to eliminate, reduce, etc. any change in charge of the sense node due to the shield parasitic capacitance.

Figure 5:
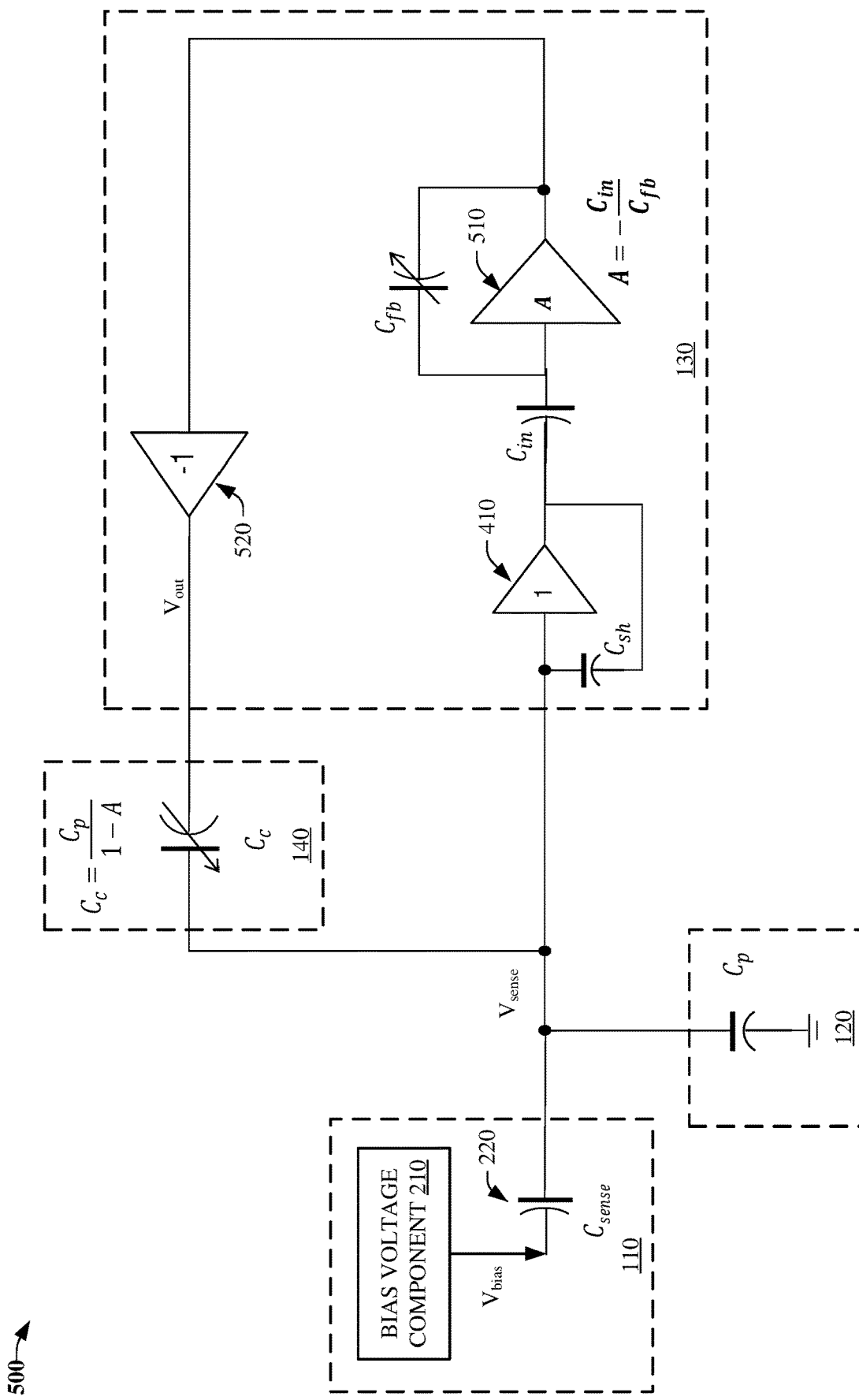
FIG. 5 illustrates a block diagram of a sensor system comprising a V2V converter component that applies a positive feedback voltage to a capacitive sense element utilizing a bootstrap buffer that is electrically connected, via an input capacitance, to an inverting amplifier comprising a negative gain that is proportional to the input capacitance, in accordance with various example embodiments.

In embodiment(s) illustrated by FIG. 5, the V2V converter component can further comprise an inverting amplifier (510) comprising a defined negative gain ("A") represented by a ratio of a defined input capacitance ("$C_{in}$") to a defined amplifier feedback capacitance ("$C_{fb}$")—in which $A=-C_{in}/C_{fb}$. In this regard, the defined input capacitance is electrically coupled between the output of the unity-gain voltage buffer and an input of the inverting amplifier; and the defined amplifier feedback capacitance is electrically coupled between the input of the inverting amplifier and an output of the inverting amplifier.

In embodiment(s), the defined amplifier feedback capacitance can be selected, programmed, etc. via programmable, e.g., one-time programmable, fuses that can connect selected capacitors of a programmable array of capacitors (not shown) together to create, form, etc. the defined amplifier feedback capacitance. In this regard, the defined negative gain can be selected, programmed, e.g., during manufacturing of the sensor system.

Further, the V2V converter component comprises a unity-gain inverting voltage buffer (520) comprising, within a defined error tolerance (e.g., 1%), a gain of negative one. In this regard, the output of the inverting amplifier is electrically connected to an input of the unity-gain inverting voltage buffer, and an output of the unity-gain inverting voltage buffer is electrically connected to the output of the V2V converter component.

As further illustrated by FIG. 5, the sensor system can comprise a defined parasitic capacitance ("$C_p$") that is electrically connected to the input of the V2V converter component. In embodiment(s), a value of the defined feedback capacitance ("$C_c$") is proportional, based on the defined negative gain of the inverting amplifier, to the defined parasitic capacitance—in which $C_c=C_p/(1-A)$, e.g., to form a "negative capacitance" coupling the output of the V2V converter component to the sense electrode, node, etc. In this regard, the value of the defined feedback capacitance can be selected, programmed, etc. based on the selected, programmed, etc. value of the defined negative gain via programmable, e.g., one-time programmable, fuses that can connect selected capacitors of a programmable array of capacitors (not shown) together to create, form, etc. the defined feedback capacitance. In embodiment(s), the defined feedback capacitance can be can be selected, programmed, e.g., during manufacturing of the sensor system, e.g., to tune a frequency corresponding to the sense electrode, e.g., that corresponds to a drive frequency of a proof mass of the sensor.

Figure 6:
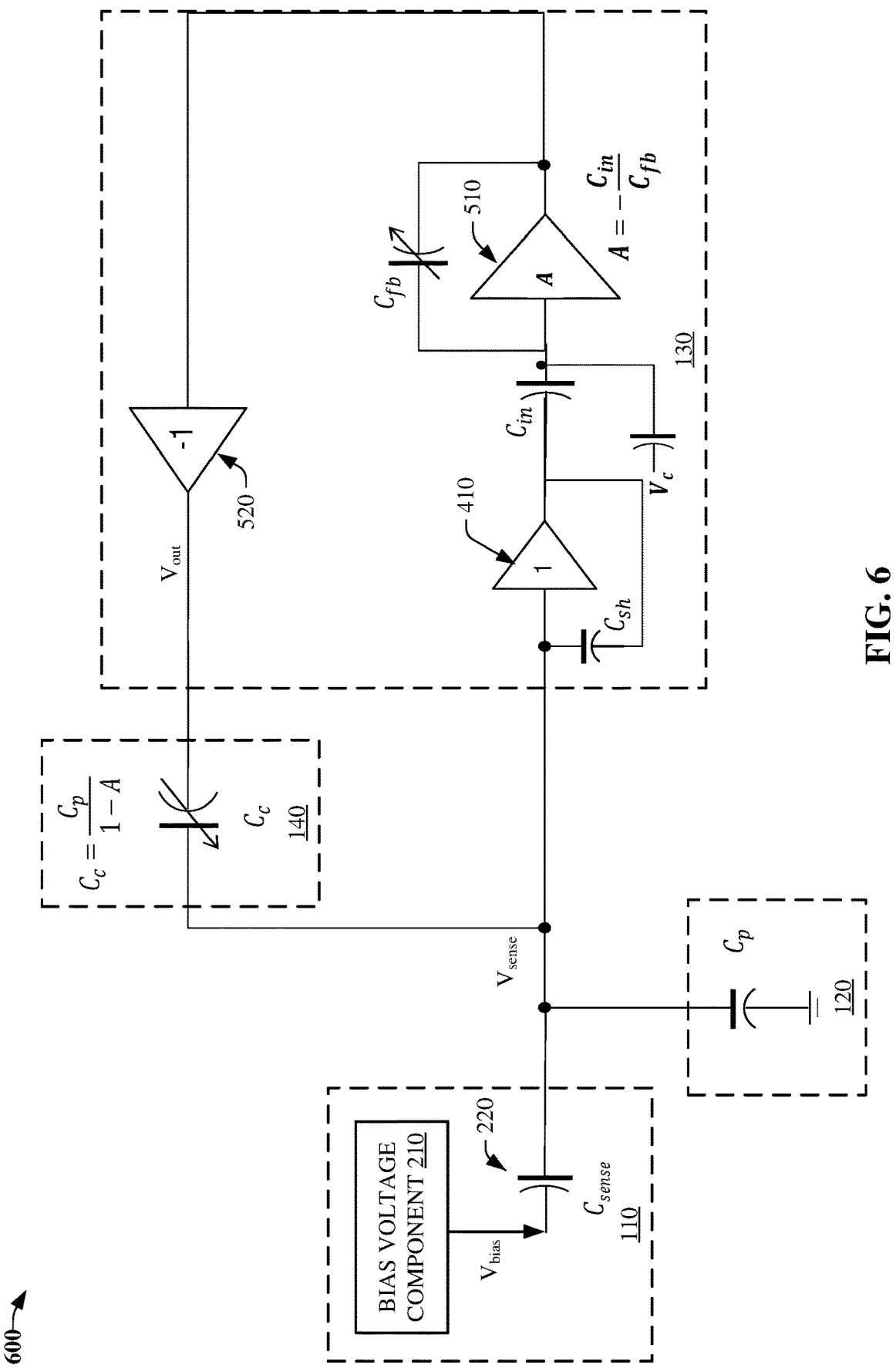
FIG. 6 illustrates a block diagram of another sensor system comprising a V2V converter component that applies a positive feedback voltage to a capacitive sense element utilizing a bootstrap buffer that is electrically connected, via an input capacitance, to an inverting amplifier comprising a negative gain that is proportional to the input capacitance, in accordance with various example embodiments.

FIG. 6 illustrates embodiment(s) of the sensor system in which the input of the inverting amplifier is coupled, via a coupling capacitance, to a defined self-test voltage ("$V_c$"). In this regard, the defined self-test voltage can be used to introduce, inject, etc. a defined quadrature cancellation voltage at the input of the unity-gain voltage buffer, e.g., to reduce a value of a quadrature signal swing that degrades a headroom of the unity-gain voltage buffer, and therefore to improve how close the output of the unity-gain voltage buffer can swing to a power supply of the unity-gain voltage buffer.

In other embodiment(s), the defined self-test voltage can be used to generate a defined force, or defined sense gap displacement, on a sense element (e.g., proof mass) of the sensor, e.g., to perform a "self-test" on the sensor, e.g., to compare detected voltage values (e.g., obtained via sense electrode(s) corresponding to various portions, stages, etc. of the V2V converter component, the feedback capacitor, etc.) to expected voltage values, e.g., that have been determined to be generated based on the defined sense gap displacement, etc.

In one embodiment, a frequency response of the proof mass can be determined by sweeping a value of the defined self-test voltage and detecting resulting respective voltage values at the sense electrode(s) corresponding to the various portions, states, etc. of the V2V converter component, the feedback capacitor, etc.

Figure 7:
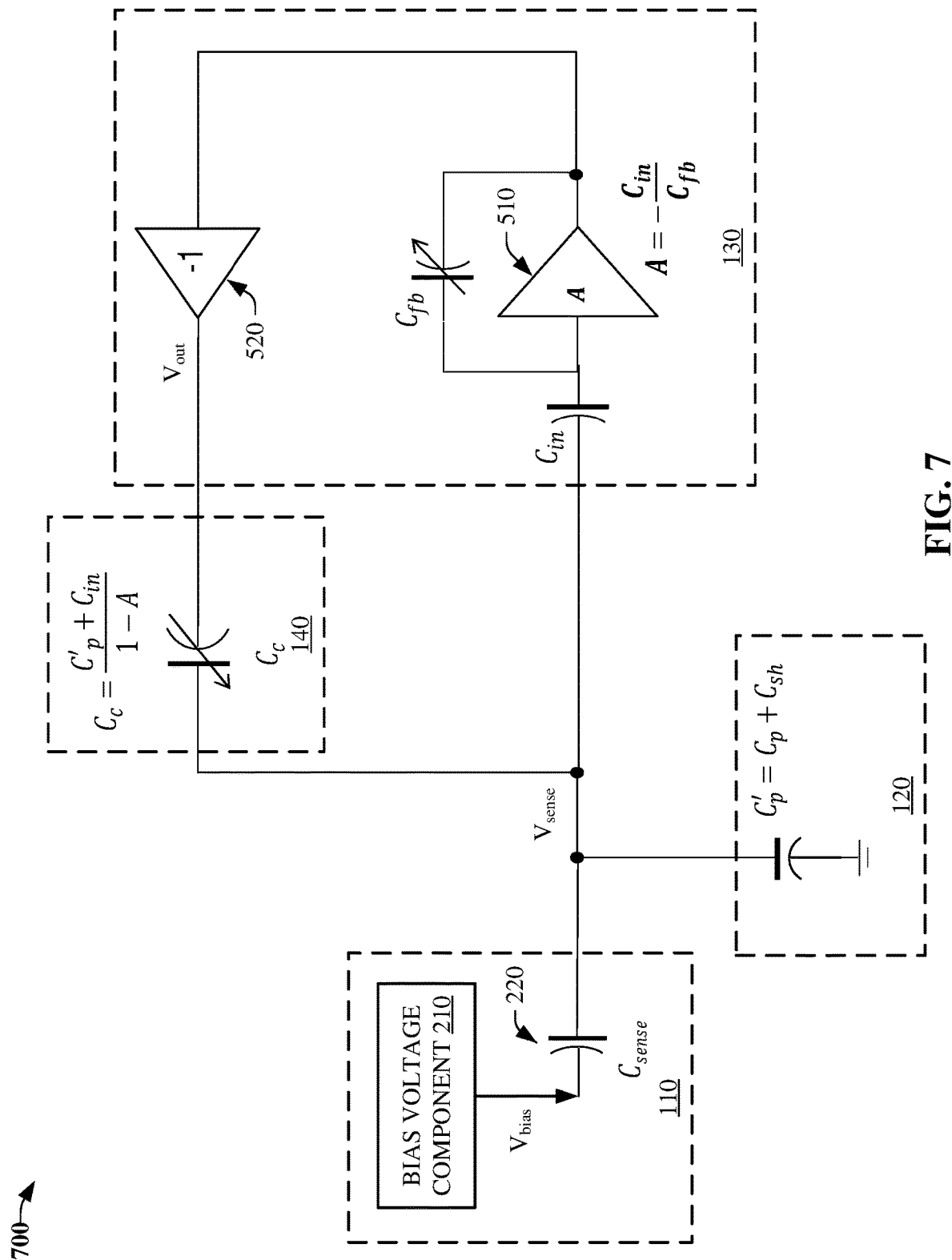
FIG. 7 illustrates a block diagram of a sensor system comprising a V2V converter component that applies a positive feedback voltage to a capacitive sense element utilizing an inverting amplifier comprising a negative gain that is proportional to an input capacitance that is electrically connected between an output of the capacitive sense element and an input of the inverting amplifier, in accordance with various example embodiments.
Figure 8:
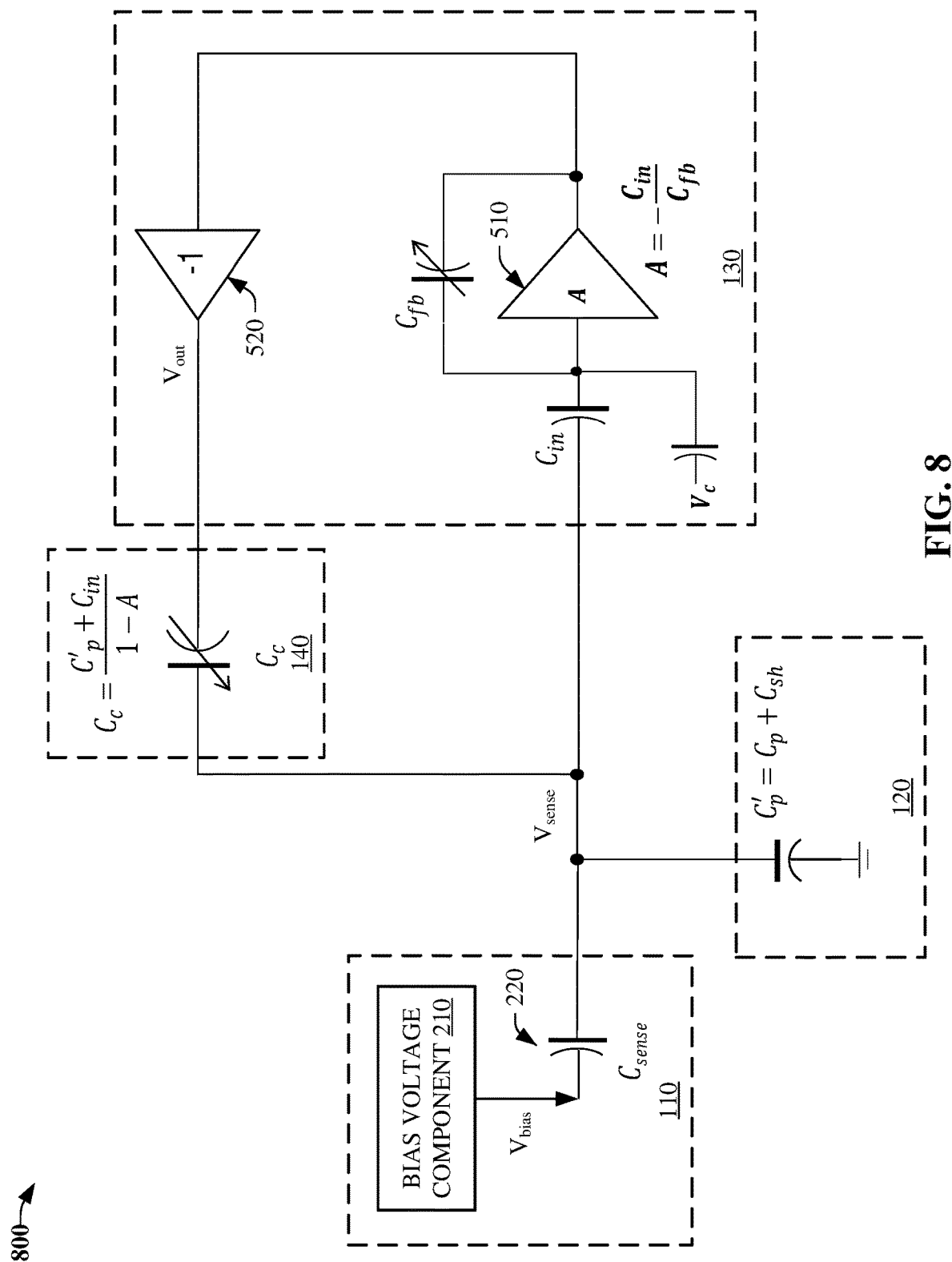
FIG. 8 illustrates a block diagram of another sensor system comprising a V2V converter component that applies a positive feedback voltage to a capacitive sense element utilizing an inverting amplifier comprising a negative gain that is proportional to an input capacitance that is electrically connected between an output of the capacitive sense element and an input of the inverting amplifier, in accordance with various example embodiments.

FIG. 7 and FIG. 8 illustrate embodiment(s) in which the sensor system does not include, utilize, etc. the bootstrapping buffer, and the defined parasitic capacitance is electrically connected to the defined input capacitance that is electrically coupled to the input of the inverting amplifier. In this regard, the defined parasitic capacitance comprises the defined shield capacitance corresponding to at least one electrical trace of the system that facilitates the shielding of at least the portion of the sense electrode from the electromagnetic field. Further, unlike embodiment(s) comprising the bootstrapping buffer, the value of the defined feedback capacitance is proportional, based on the defined negative gain of the inverting amplifier, to a sum of the defined parasitic capacitance and the defined input capacitance.

Figure 9:
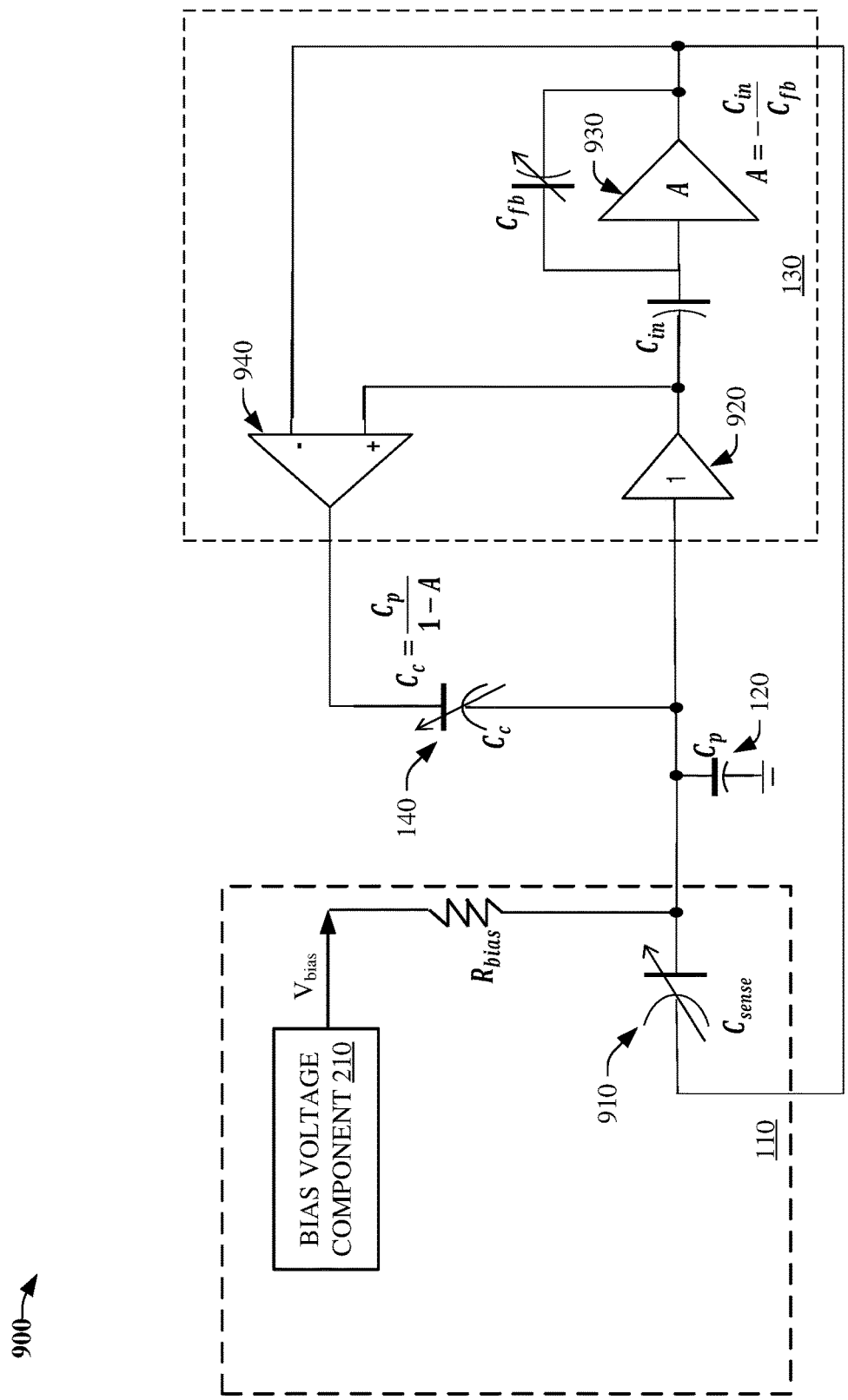
FIG. 9 illustrates a block diagram of a sensor system comprising a microphone, in accordance with various example embodiments.

FIG. 9 illustrates a block diagram of a sensor system (900) comprising an electromechanical sensor (110) comprising a microphone (910), in accordance with various example embodiments. The microphone comprises a sense capacitor (see "$C_{sense}$") comprising a sense electrode, and a bias voltage component (210) applies, via a bias resistor ("$R_{bias}$"), a bias voltage (e.g., "$V_{bias}$") to the sense electrode.

In turn, the sensor system comprises a V2V converter component (130) that couples, via a feedback capacitor (140) coupled between the V2V converter component and the sense electrode, a positive feedback voltage to the sense electrode, e.g., to maintain a constant charge at the sense electrode. In this regard, the V2V converter component comprises a unity-gain voltage buffer (920) comprising, within a defined error tolerance (e.g., 1%), a gain of one. Further, an input of the V2V converter component is electrically connected to, comprises, etc. an input of the unity-gain voltage buffer. An output of the unity-gain voltage buffer is electrically connected to a non-inverting input of a differential amplifier (940), and is electrically coupled, via a defined input capacitance ("$C_{in}$"), to an inverting amplifier (930). The inverting amplifier comprising a defined negative gain ("A") represented by a ratio of the defined input capacitance ("$C_{in}$") to a defined amplifier feedback capacitance ("$C_{fb}$")—in which $A=-C_{in}/C_{fb}$. In this regard, the defined amplifier feedback capacitance is electrically coupled between the input of the inverting amplifier and an output of the inverting amplifier.

The defined amplifier feedback capacitance can be selected, programmed, etc. via programmable, e.g., one-time programmable, fuses that can connect selected capacitors of a programmable array of capacitors (not shown) together to create, form, etc. the defined amplifier feedback capacitance. In this regard, the defined negative gain can be selected, programmed, e.g., during manufacturing of the sensor system. Further, the output of the inverting amplifier is electrically connected to an inverting input of the differential amplifier, and an output of the differential amplifier is electrically connected to the output of the V2V converter component.

As further illustrated by FIG. 9, the sensor system can comprise a defined parasitic capacitance ("$C_p$") that is electrically connected to the input of the V2V converter component. In embodiment(s), a value of the defined feedback capacitance ("$C_c$") is proportional, based on the defined negative gain of the inverting amplifier, to the defined parasitic capacitance—in which $C_c = C_p/(1-A)$, e.g., to form a "negative capacitance" coupling the output of the V2V converter component to the sense electrode. In this regard, the value of the defined feedback capacitance can be selected, programmed, etc. based on the selected, programmed, etc. value of the defined negative gain via programmable, e.g., one-time programmable, fuses that can connect selected capacitors of a programmable array of capacitors (not shown) together to create, form, etc. the defined feedback capacitance. In embodiment(s), the defined feedback capacitance can be selected, programmed, e.g., during manufacturing of the sensor system, e.g., to tune a frequency corresponding to the sense electrode, e.g., corresponding to a resonant frequency of a membrane of the microphone.

Figure 10:
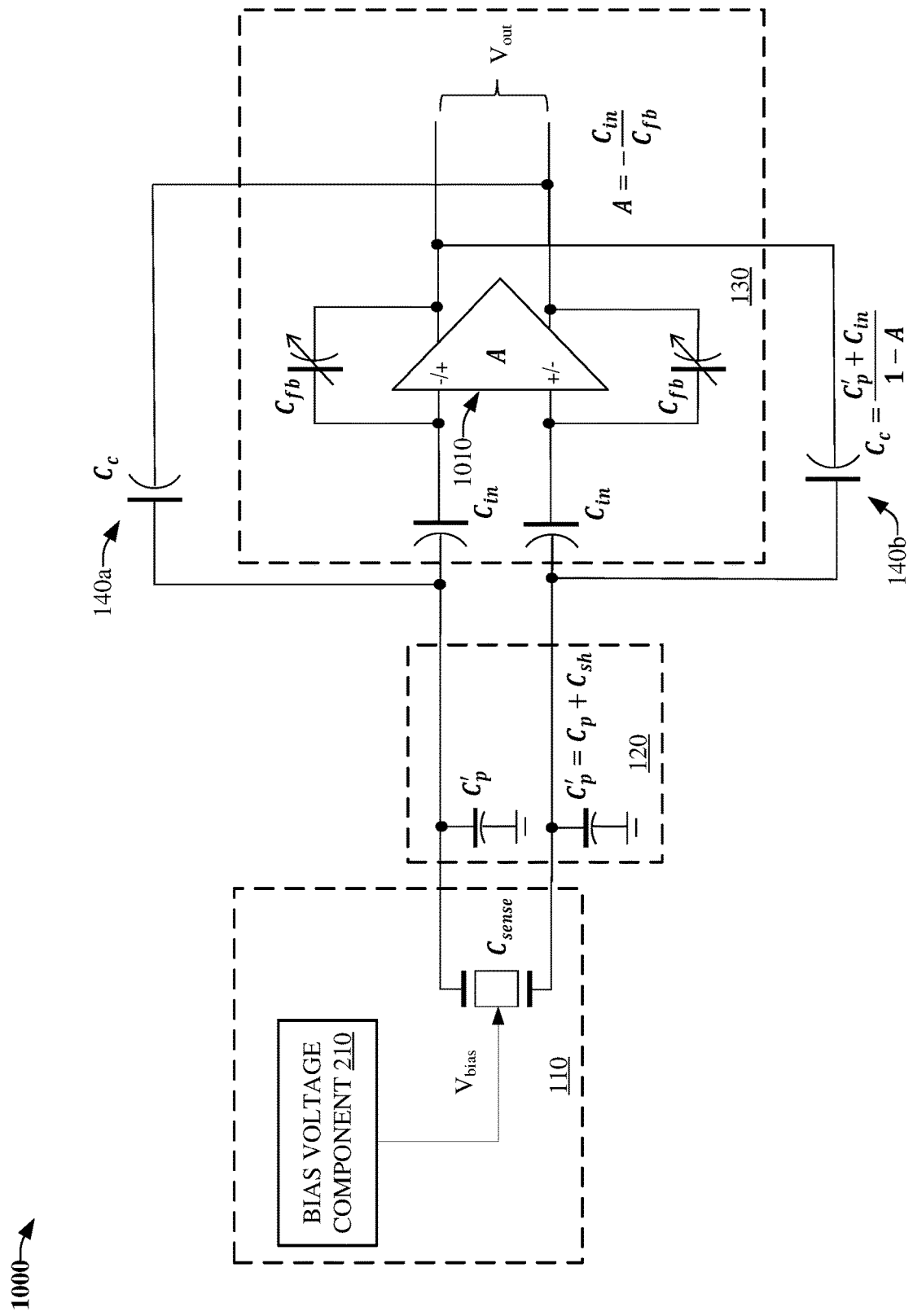
FIG. 10 illustrates a block diagram of a sensor system comprising a V2V component comprising a differential amplifier, in accordance with various example embodiments.

FIG. 10 illustrates a block diagram of a sensor system (1000) comprising a V2V component (130) comprising a differential amplifier (1010), in accordance with various example embodiments. As illustrated by FIG. 10, a bias voltage component (210) can apply a bias voltage ($V_{bias}$) to a sense element, proof mass, etc. of an electromechanical sensor (110).

Further, sense electrodes of respective capacitors, which are electronically coupled to the sense element, proof mass, etc., are electronically coupled, via respective defined input capacitances ("$C_{in}$"), to respective differential inputs of the differential amplifier. In turn, respective defined amplifier feedback capacitances ("$C_{fb}$") are electrically coupled between the respective differential inputs of the differential amplifier and respective outputs of the differential amplifier—in which a gain ("A") of the differential amplifier is $A = -C_{in}/C_{fb}$.

As further illustrated by FIG. 10, respective defined feedback capacitances ("$C_c$") are electrically connected between the respective outputs of the differential amplifier and the sense electrodes. In this regard, values of the respective defined feedback capacitances are proportional, based on the defined negative gain of the differential amplifier, to respective defined parasitic capacitances ("$C'_p$") that are electrically connected to the respective differential inputs of the differential amplifier—in which $C_c = (C'_p + C_{in})/(1-A)$, e.g., to form "negative capacitances" coupling the respective differential outputs to the sense electrodes.

FIG. 11-FIG. 14 illustrate methodologies in accordance with the disclosed subject matter. For simplicity of explanation, the methodologies are depicted and described as a series of acts. It is to be understood and appreciated that various embodiments disclosed herein are not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as respective series of interrelated states via respective state diagrams or events.

Figure 11:
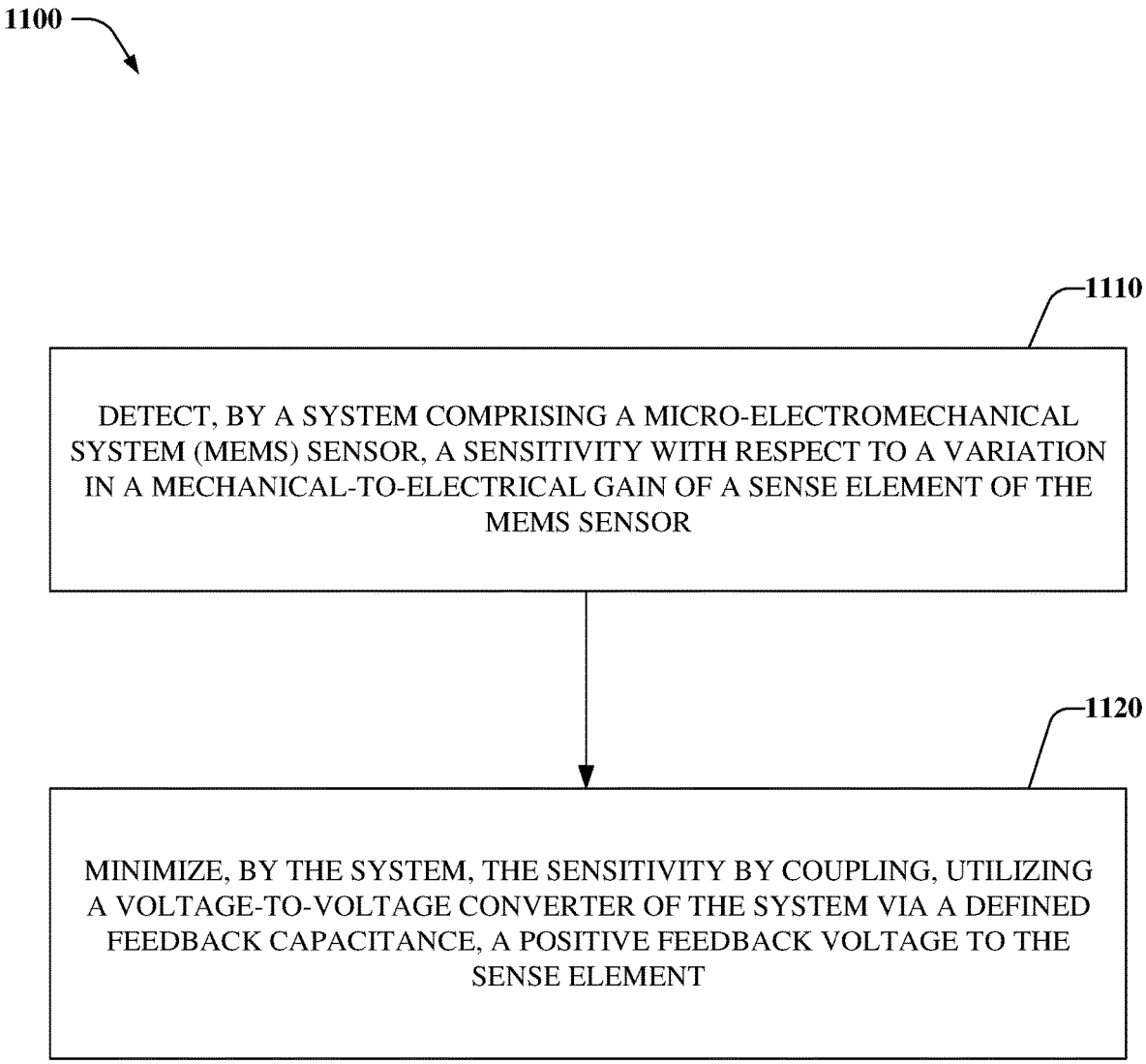
FIG. 11 illustrates a flowchart of a method associated with minimizing a sensitivity of a sense element of an electromechanical sensor with respect to a variation of a mechanical-to-electrical gain of the sense element, in accordance with various example embodiments.

Referring now to FIG. 11, a flowchart of a method associated with minimizing a sensitivity of a sense element of a MEMS sensor with respect to a variation of a mechanical-to-electrical gain of the sense element is illustrated, in accordance with various example embodiments. At 1110, the system, e.g., a gyroscope etc. can detect a sensitivity with respect to a variation in a mechanical-to-electrical gain of a sense element of the MEMS sensor. At 1120, the system can minimize the sensitivity by coupling, utilizing a V2V converter of the system via a defined feedback capacitance, a positive feedback voltage to the sense element.

Figure 12:
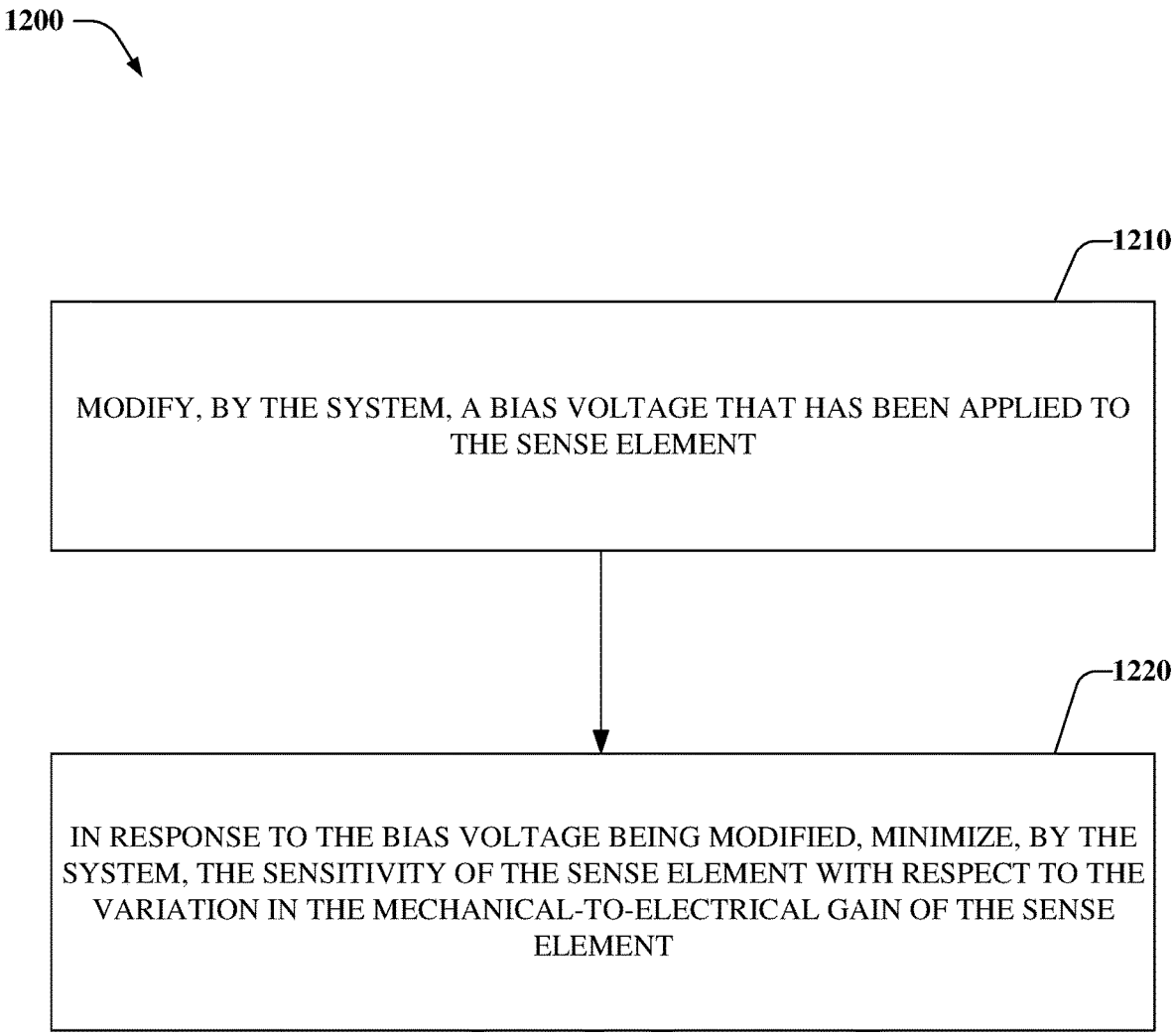
FIG. 12 illustrates a flowchart of a method associated with minimizing the sensitivity of the sense element in response to modification of a bias voltage that has been applied to the sense element, in accordance with various example embodiments.

FIG. 12 illustrates a flowchart of a method associated with minimizing the sensitivity of the sense element in response to modification of a bias voltage that has been applied to the sense element, in accordance with various example embodiments. At 1210, the system can modify a bias voltage that has been applied to the sense element. At 1220, in response to the bias voltage being modified, the system can minimize the sensitivity of the sense element with respect to the variation in the mechanical-to-electrical gain of the sense element.

Figure 13:
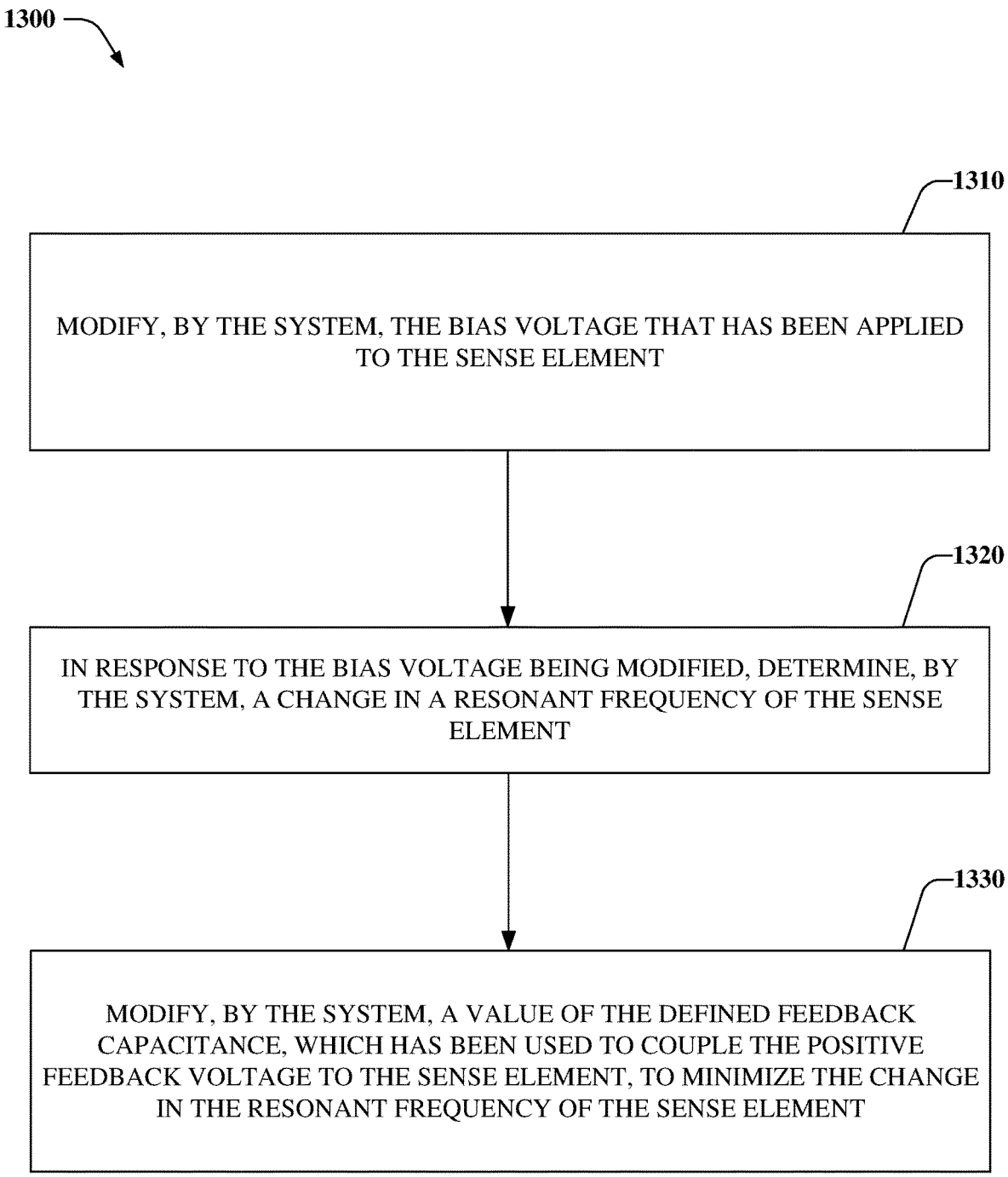
FIG. 13 Illustrates a flow chart of a method associated with minimizing the sensitivity of the sense element in response to modification of a value of a defined feedback capacitance that has been used to apply a positive feedback voltage to the sense element, in accordance with various example embodiments.

For example, in the flowchart illustrated by FIG. 13, in response to the bias voltage being modified at 1310, the system can determine, at 1320, a change in a resonant frequency of the sense element. In turn, at 1330, the system can modify a value of the defined feedback capacitance ("$C_c$"), which has been used to couple the positive feedback voltage to the sense element, to minimize the change in the resonant frequency of the sense element.

Figure 14:
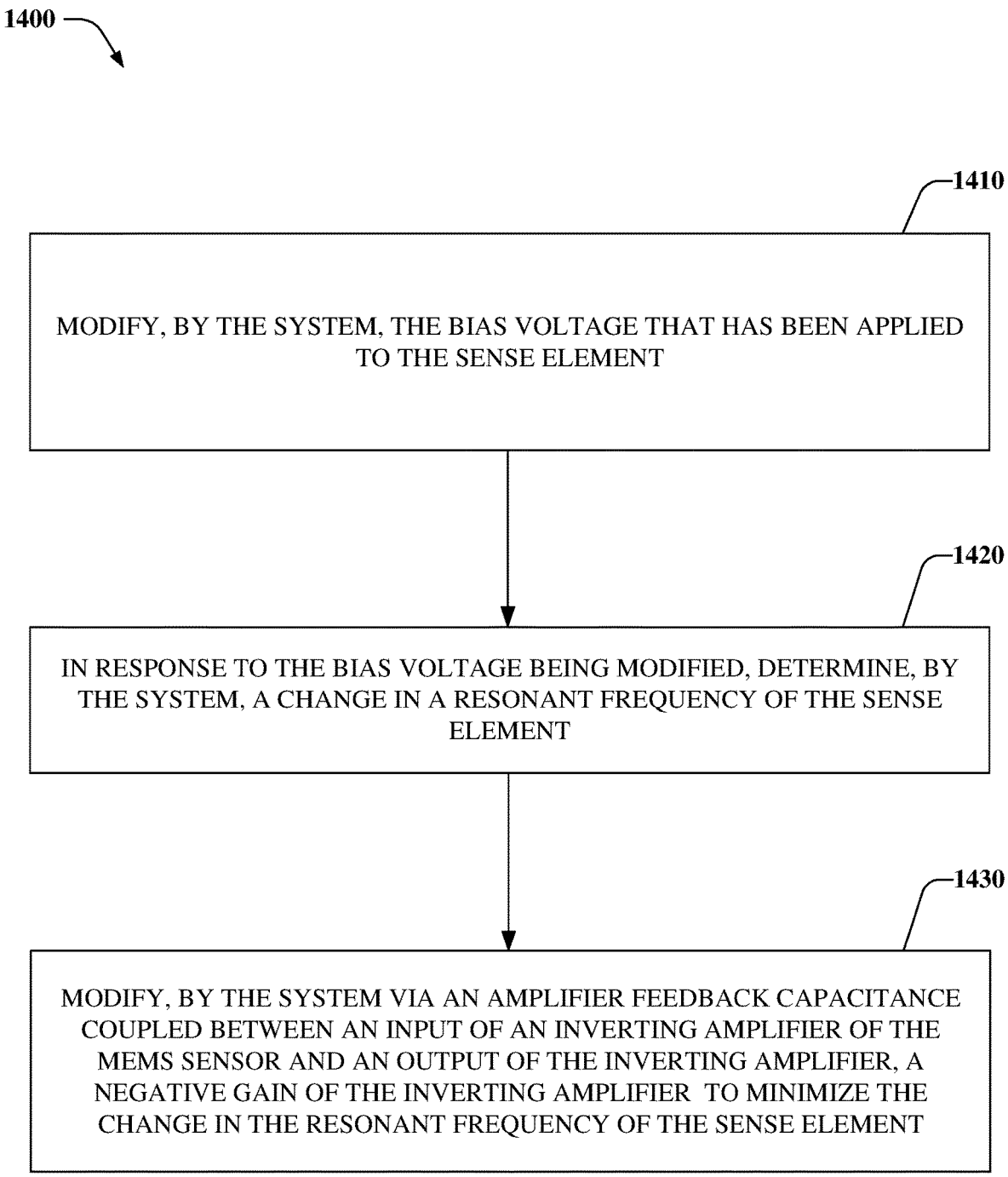
FIG. 14 illustrates a flow chart of a method associated with minimizing the sensitivity of the sense element in response to modification of an amplifier feedback capacitance coupled between an input of an inverting amplifier of the electromechanical sensor and an output of the inverting amplifier, in accordance with various example embodiments.

In another example illustrated in the flow chart of FIG. 14, in response to the bias voltage that has been applied to the sense element being modified at 1410, and in response to a change in the resonant frequency of the sense element being determined at 1420, the system can modify, at 1430, via an amplifier feedback capacitance ("$C_{fb}$") coupled between an input of an inverting amplifier of the MEMS sensor and an output of the inverting amplifier, a negative gain of the inverting amplifier to minimize the change in the resonant frequency of the sense element.

Figure 15:
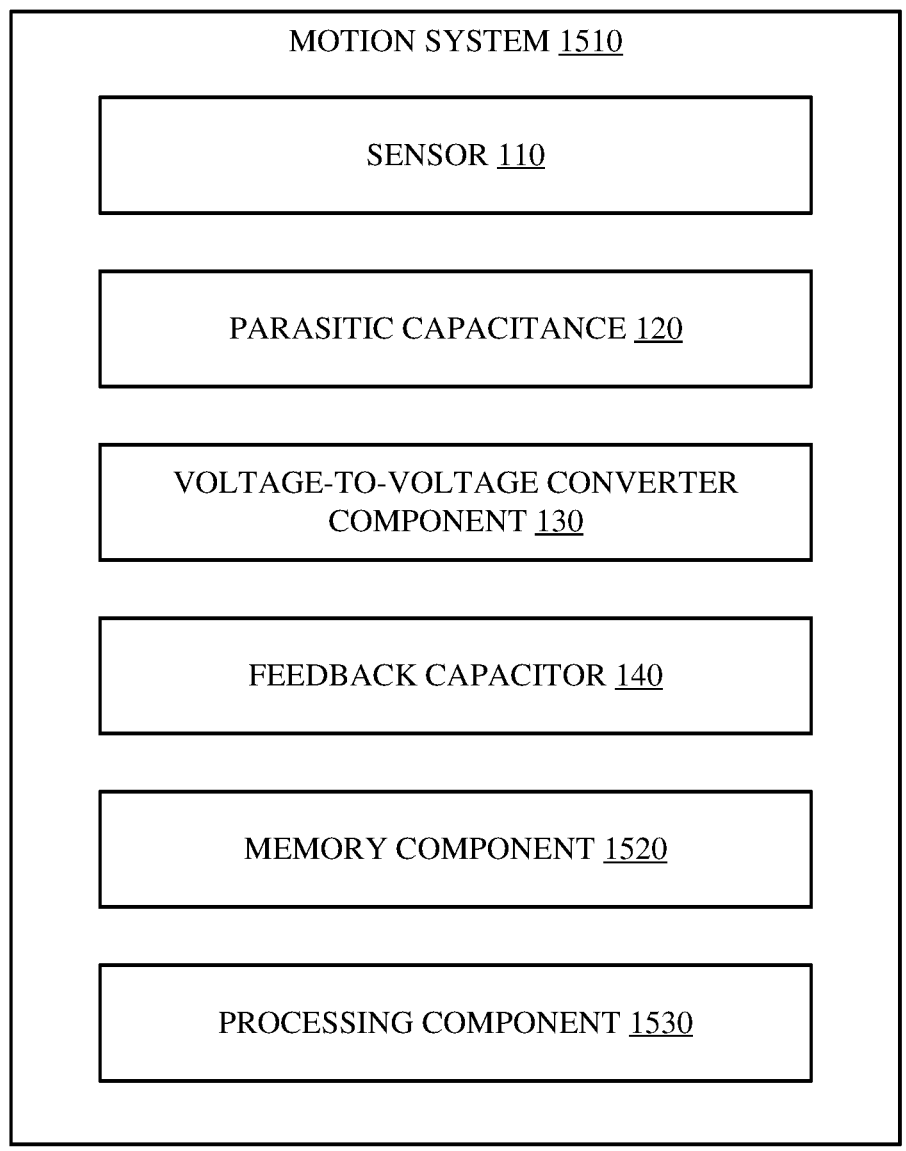
FIG. 15 illustrates a motion system comprising a sensor architecture that utilizes a V2V converter to apply a positive feedback voltage to a sensor to facilitate a reduction of charge flow in the sensor, in accordance with various example embodiments.

FIG. 15 illustrates a motion system (1510), e.g., a gyroscope, etc. comprising a sensor architecture that utilizes a V2V converter component (130) to couple, via a feedback capacitance, a positive feedback voltage to sense element of a sensor (110) to facilitate a reduction of charge flow in the sensor representing spring softening, in accordance with various example embodiments. In this regard, the motion system can utilize a memory component (1520) and a processing component (1530) to perform, via the V2V converter component, various operations described herein, e.g., with respect to using, controlling, etc. the defined self-test voltage to inject a defined quadrature cancellation voltage at the input of the unity-gain voltage buffer, e.g., to reduce a value of a quadrature signal swing that degrades a headroom of the unity-gain voltage buffer; with respect to using, controlling, etc. the defined self-test voltage to generate a defined force, or defined sense gap displacement, on a sense element (e.g., a proof mass) of the sensor, e.g., to perform a "self-test" on the sensor, e.g., to compare detected voltage values (e.g., obtained via sense electrode(s) corresponding to various portions, stages, etc. of the V2V converter component, the feedback capacitor, etc.) to expected voltage values, e.g., that have been determined to be generated based on the defined sense gap displacement, etc.

In one embodiment, the motion system can utilize the memory component and the processing component to determine a frequency response of the proof mass by sweeping a value of the defined self-test voltage, and detecting resulting respective voltage values at the sense electrode(s) corresponding to the various portions, states, etc. of the V2V converter component, the feedback capacitor, etc.

As it employed in the subject specification, the term "component" refers to substantially any analog and/or digital based device(s), circuit(s), etc. comprising, e.g., a resistor, a capacitor, a transistor, a diode, an inductor, a memory, a programmable device, e.g., fuse, field programmable gate array (FPGA), complex programmable logic device (CPLD), etc. relevant to performing operations and/or functions of circuit(s), device(s), system(s), etc. disclosed herein. Further, the term "processing component" can refer to substantially any computing processing unit or device (e.g., MAC, etc.), comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an ASIC, a digital signal processor (DSP), an FPGA, a programmable logic controller (PLC), a CPLD, a discrete gate or transistor logic, discrete hardware components, an analog circuit, or any combination thereof designed to perform the functions and/or processes described herein. Further, a processor can exploit nano-scale architectures such as, but not limited to, molecular and quantum-dot based transistors, switches and gates, e.g., in order to optimize space usage or enhance performance of mobile devices. A processor can also be implemented as a combination of computing processing units, devices, etc.

In the subject specification, the term "memory", "memory component", and substantially any other information storage component relevant to operation and functionality of a motion system (e.g., 1510) and/or devices disclosed herein refer to "memory components," or entities embodied in a "memory," or components comprising the memory. It will be appreciated that the memory can include volatile memory and/or nonvolatile memory. By way of illustration, and not limitation, volatile memory, can include random access memory (RAM), which can act as external cache memory. By way of illustration and not limitation, RAM can include synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and/or Rambus dynamic RAM (RDRAM). In other embodiment(s) nonvolatile memory can include read only memory (ROM), programmable ROM (PROM), electrically programmable ROM (EPROM), electrically erasable ROM (EEPROM), or flash memory. Additionally, the components and/or devices disclosed herein can comprise, without being limited to comprising, these and any other suitable types of memory.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Aspects of systems, apparatus, devices, processes, and process blocks explained herein can be embodied within hardware, such as an ASIC or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:
1. A microphone, comprising:
 an electromechanical sensor comprising
  a capacitive sense element comprising a first node and a second node,
  a bias voltage component that applies a bias voltage to the first node of the capacitive sense element, and a sensitivity with respect to a variation of a mechanical-to-electrical gain of the capacitive sense element; and a voltage-to-voltage converter component that
generates, via a first output, a positive feedback voltage,
generates, via a second output, a negative feedback voltage, and
minimizes the sensitivity by coupling, via a defined feedback capacitance, the positive feedback voltage to the first node of the capacitive sense element, wherein the first node of the capacitive sense element is electrically coupled to an input of the voltage-to-voltage converter component, and wherein the negative feedback voltage is electrically coupled to the second node of the capacitive sense element.

2. The microphone of claim 1, wherein the voltage-to-voltage converter component minimizes the sensitivity by maintaining, via the defined feedback capacitance, a constant charge at the first node of the capacitive sense element.

3. The microphone of claim 1, wherein the voltage-to-voltage converter component comprises a unity-gain voltage buffer comprising, within a defined error tolerance, a gain of one, and wherein the input of the voltage-to-voltage converter component is electrically connected to an input of the unity-gain voltage buffer.

4. The microphone of claim 3, wherein the voltage-to-voltage converter component further comprises:

a defined input capacitance;
a defined amplifier feedback capacitance;
an inverting amplifier comprising a defined negative gain represented by a ratio of the defined input capacitance to the defined amplifier feedback capacitance, wherein the defined input capacitance is electrically coupled between an output of the unity-gain voltage buffer and an input of the inverting amplifier, and wherein the defined amplifier feedback capacitance is electrically coupled between the input of the inverting amplifier and an output of the inverting amplifier; and
a differential amplifier, wherein the output of the inverting amplifier is electrically coupled to an inverting input of the differential amplifier, and wherein an output of the differential amplifier is electrically coupled to the output of the voltage-to-voltage converter component.

5. The microphone of claim 4, further comprising a defined parasitic capacitance that is electrically coupled to the input of the voltage-to-voltage converter component.

6. The microphone of claim 5, wherein a value of the defined feedback capacitance is proportional, based on the defined negative gain of the inverting amplifier, to the defined parasitic capacitance.

7. The microphone of claim 4, wherein the output of the inverting amplifier is electrically coupled to the second node of the capacitive sense element.

* * * * *